US005812163A

United States Patent [19]
Wong

[11] Patent Number: 5,812,163
[45] Date of Patent: Sep. 22, 1998

[54] INK JET PRINTER FIRING ASSEMBLY WITH FLEXIBLE FILM EXPELLER

[75] Inventor: Marvin G. Wong, Corvallis, Oreg.

[73] Assignee: Hewlett-Packard Company, Palo Alto, Calif.

[21] Appl. No.: 601,485

[22] Filed: Feb. 13, 1996

[51] Int. Cl.[6] .............................. B41J 2/045; H01L 41/04
[52] U.S. Cl. ................................ 347/68; 347/71; 310/327
[58] Field of Search ................................ 347/54, 68, 70, 347/71; 310/327, 328, 800

[56] References Cited

U.S. PATENT DOCUMENTS

| | | | |
|---|---|---|---|
| 4,480,259 | 10/1984 | Kruger et al. | 347/63 |
| 5,087,924 | 2/1992 | Zaba et al. | 347/75 |
| 5,170,177 | 12/1992 | Stanley et al. | 347/10 |
| 5,311,218 | 5/1994 | Ochiai et al. | 347/71 |
| 5,339,101 | 8/1994 | Rawson et al. | 347/46 |
| 5,365,645 | 11/1994 | Walker et al. | 29/25.35 |
| 5,400,064 | 3/1995 | Pies et al. | 347/68 |
| 5,414,916 | 5/1995 | Hayes | 29/25.35 |
| 5,435,060 | 7/1995 | Hayes et al. | 29/890.1 |
| 5,436,648 | 7/1995 | Stortz et al. | 347/10 |
| 5,461,403 | 10/1995 | Wallace et al. | 347/10 |
| 5,666,141 | 9/1997 | Matoba et al. | 347/54 |

FOREIGN PATENT DOCUMENTS

| | | | |
|---|---|---|---|
| 0408306A | 7/1990 | European Pat. Off. | H01L 41/09 |
| 0634273 A2 | 1/1995 | European Pat. Off. | 347/54 |
| 2265859A | 10/1993 | United Kingdom | B41J 2/046 |
| 2288765A | 11/1995 | United Kingdom | B41J 2/045 |
| WO9425279 | 11/1994 | WIPO | B41J 2/16 |
| WO9504658 | 2/1995 | WIPO | B41J 2/045 |

*Primary Examiner*—Peter S. Wong
*Assistant Examiner*—Gregory J. Toatley, Jr.

[57] ABSTRACT

An ink jet printing apparatus having an orifice plate at least in part defining a chamber, and at least in part defining a nozzle providing fluid communication out of the chamber, and an ink inlet connected between the chamber and a supply of ink. A multilayer flexible firing film is attached to the orifice plate and at least in part defines the chamber, such that the film provides a wall of the chamber. The film has a first layer facing the chamber and connected to the orifice plate, and a second layer laminated to the first layer and spaced apart at least slightly from the orifice plate. At least one of the first and second layers is dimensionally responsive to an application of energy, such that the area of said layer changes in response to the application of energy, whereby the film may flex between a firing position in which the film is flexed toward the orifice plate to expel ink from the nozzle, and a refilling position in which the film is flexed away from the orifice plate to draw ink via the inlet into the chamber.

20 Claims, 4 Drawing Sheets

INK JET PRINTER FIRING ASSEMBLY WITH FLEXIBLE FILM EXPELLER

FIELD OF THE INVENTION

This invention relates to ink jet printer pens, and more particularly to apparatus and methods for expelling ink droplets from a firing chamber.

BACKGROUND AND SUMMARY OF THE INVENTION

Ink jet printing mechanisms use pens that shoot droplets of colorant onto a printable surface to generate an image. Such mechanisms may be used in a wide variety of applications, including computer printers, plotters, copiers, and facsimile machines. For convenience, the concepts of the invention are discussed in the context of a printer. An ink jet printer typically includes a print head having a multitude of independently addressable firing units. Each firing unit includes an ink chamber connected to a common ink source, and an ink outlet nozzle. A transducer within the chamber provides the impetus for expelling ink droplets through the nozzles.

In thermal ink jet pens, the transducer is a resistor that provides sufficient heat to rapidly vaporize a small portion of ink within the chamber. The expansion provides for the displacement of a droplet of liquid ink from the nozzle. The heat to which the ink is exposed in a thermal ink jet pen prevents the use of thermally unstable ink formulations that might otherwise provide desirable performance and value. Conventional piezoelectric ink jet pens avoid the disadvantages of thermally stressing the ink by using a piezoelectric transducer in each firing chamber to dimensionally expand in response to the application of a voltage to provide the displacement to expel a droplet having a volume limited to the volume change of the piezoelectric material. Conventional piezoelectric transducers thus have limited volume displacement capability, and are susceptible to degradation by direct exposure to some inks that might otherwise be desirably employed, and have other disadvantages related to limited miniaturization, cost, and reliability.

These disadvantages are overcome or reduced by providing an ink jet printing apparatus having an orifice plate at least in part defining a chamber, and at least in part defining a nozzle providing fluid communication out of the chamber, and an ink inlet connected between the chamber and a supply of ink. A multilayer flexible firing film is attached to the orifice plate and at least in part defines the chamber, such that the film provides a wall of the chamber. The film has a first layer facing the chamber and connected to the orifice plate, and a second layer laminated to the first layer and spaced apart at least slightly from the orifice plate. At least one of the first and second layers is dimensionally responsive to an application of energy, such that the area of said layer changes in response to the application of energy, whereby the film may flex between a firing position in which the film is flexed toward the orifice plate to expel ink from the nozzle, and a refilling position in which the film is flexed away from the orifice plate to draw ink via the inlet into the chamber.

DETAILED DESCRIPTION OF A PREFERRED EMBODIMENT

Figure 1:
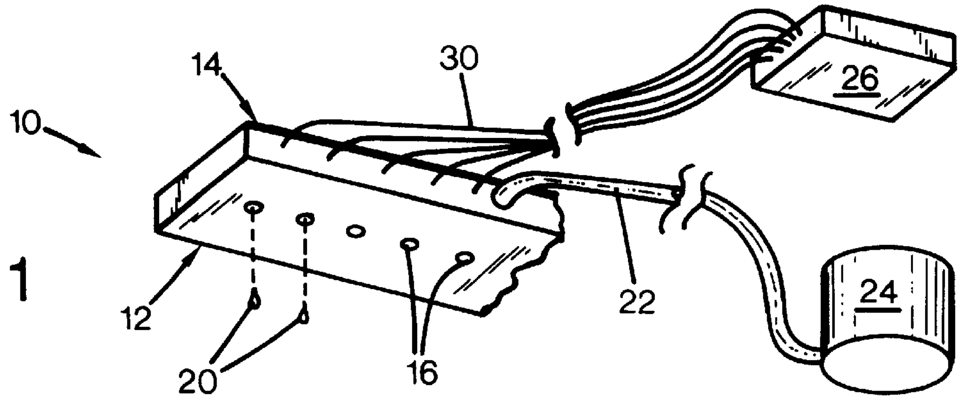
FIG. 1 is a simplified perspective view of a print head according to a preferred embodiment of the invention.

FIG. 1 shows an ink jet print head 10 having an orifice plate 12 and a firing film 14 laminated together. The orifice plate defines an array of nozzles 16 through which ink droplets 20 may be expelled. An ink supply conduit 22 connected to an ink supply 24 provides ink to the print head. A cable 30 having a plurality of lines connects the film 14 to a controller 26, which may be connected to a source of printing data to be printed onto a sheet of printer medium.

Figure 2:
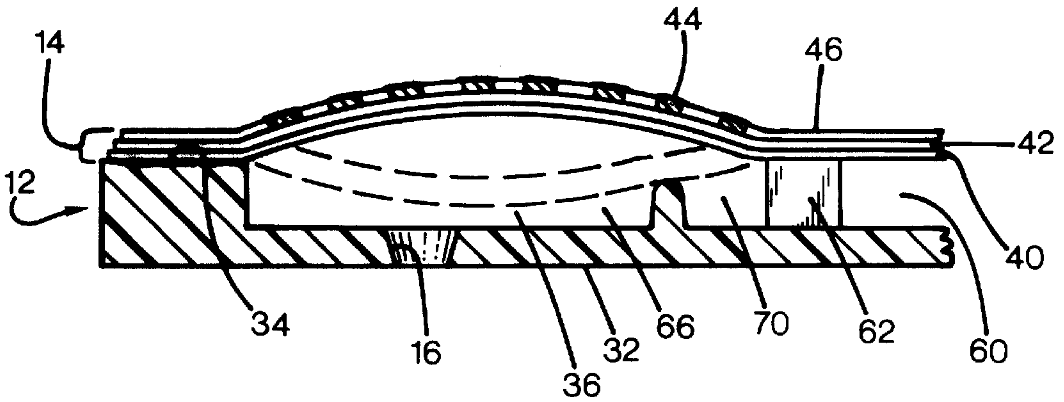
FIG. 2 is an enlarged cross sectional view of the embodiment of FIG. 1.

As shown in FIG. 2, the orifice plate has a front surface 32 through which the nozzles open, and which faces the surface to be printed. A rear surface 34 faces the opposite direction. The firing film 14 is laminated to the rear surface 34 to enclose a firing chamber 36. The firing film includes an inner layer 40 formed of a flexible inert polymer such as polyimide that is resistant to chemical interaction with inks that may be used. An active layer 42 is laminated to the inner layer and includes traces 44 formed of a piezoelectric material, such as polyvinylidene fluoride, and connected to the cable 30. The entire active layer 42 may be formed of such material, the traces may be carried on a base film as shown, or the traces may be printed directly on the inner layer 40. The piezoelectric traces have a thickness less than that of the remainder of the firing film on which they rest. Thus, the firing film does not collapse or ripple in response to contraction of the piezoelectric traces. In an alternative embodiment, the active layer may be formed of a partially electrically resistive material, such as a bimetallic layering of tantalum-aluminum, that heats upon application of a current, joined with but insulated from an aluminum layer, which has a different coefficient of thermal expansion from the tantalum-aluminum layer. A protective layer 46 is provided by a flexible conformal coating to protect the traces from damage. Coatings such as polyimide, and others used on printed circuit boards are suitable. The firing film is preferably formed with a series of slight concave domes, each corresponding to a single firing chamber. Such domes are stable in a single concave position without application of energy, and may be shifted to a second convex position (shown) by application of a voltage or other energy. The bi-stable nature of such thin domes allows for the transition between positions by an application of energy above a selected threshold, with the dome returning to the original position upon removal of the applied energy.

Figure 3:
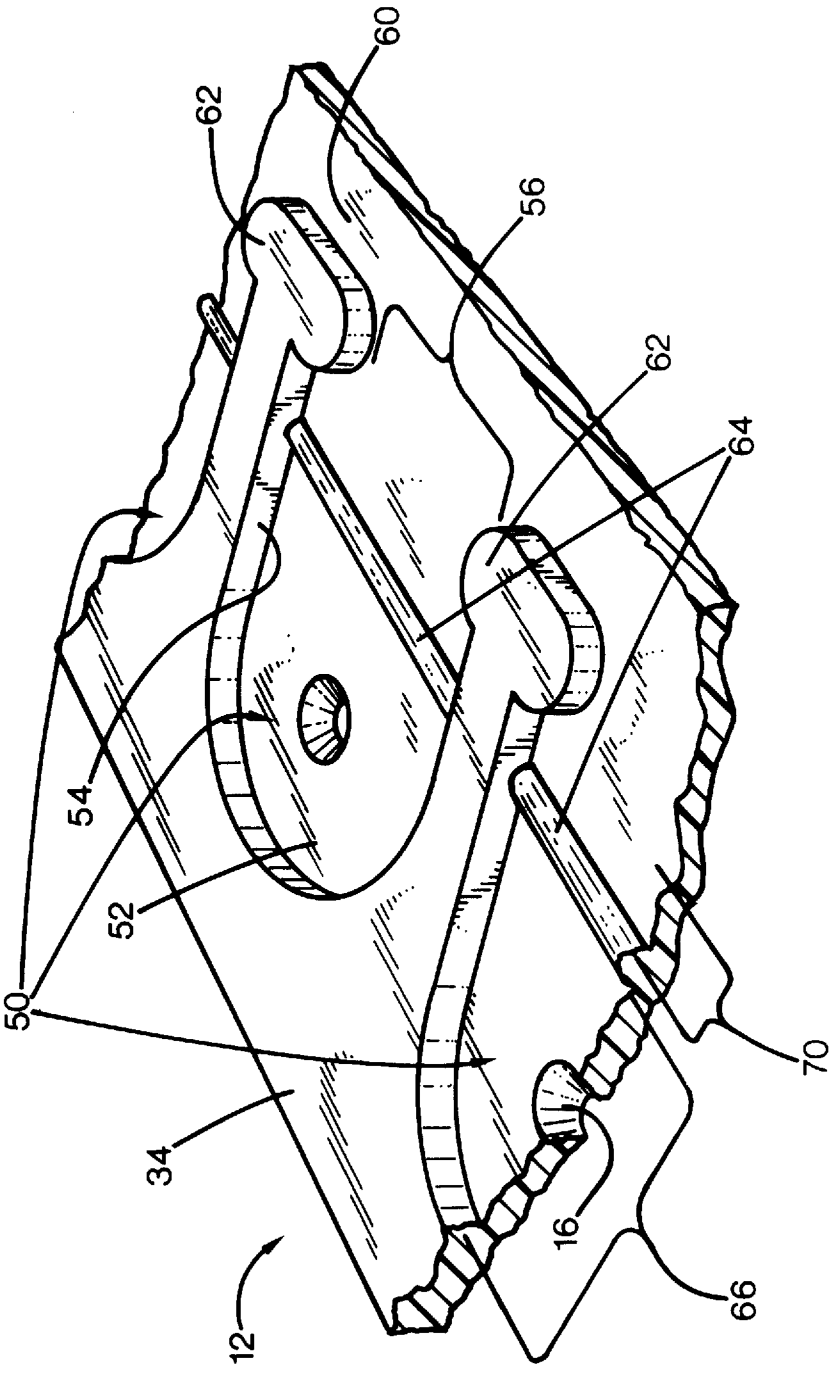
FIG. 3 is an enlarged perspective view of an orifice plate of the embodiment of FIG. 1.

As shown in FIG. 3, the orifice plate 12 defines a linear array of separate firing basins 50, each corresponding to a firing chamber 36. Each basin includes a floor 52 parallel to and recessed at a level below the rear surface 34 of the plate 12. The perimeter of each basin is defined by a side wall 54 that is formed as the step between the rear surface 43 and the floor 52. The side wall 54 has a "U" shape that partially encompasses the nozzle 16 that is formed in the center of the basin. The basin has an ink inlet 56 opening into an ink manifold 60 that communicates with the ink inlets of numerous firing chambers. To provide restricted ink flow and to reduce ink backwash out of the inlet when a chamber is fired, the side walls include lobes 62 that protrude inward into the firing chamber to define an inlet gap that is narrower than the width of an inner portion of the chamber.

Each basin in the orifice plate includes a ridge 64 protruding above the floor 52, and spanning across the basin to divide the basin between the nozzle 16 and the inlet 56. The ridge divides the basin into a nozzle region 66 and an inlet region 70. The ridge protrudes above the floor by a distance preferably greater than half the depth of the basin, so that the top of the ridge is closer to the level of the rear surface 34 than to the level of the floor 52. The top of the ridge must be below the level of the rear surface 34 to provide a ridge gap between the ridge and the film 14 in a hypothetical flat condition.

In the preferred embodiment, the ridge rises to a height of between about 70–85% of the depth of the basin so that the gap is pinched off quickly during the film's travel into the firing chamber. The spacing between nozzles may range upward from about 0.003 inch (0.08 mm) depending on the printer design requirements. The depth of the basins is preferably at least about 0.002–0.010 inch (0.05–0.25 mm) or more. The ridge gap should be proportional to the chamber width.

Figure 4:
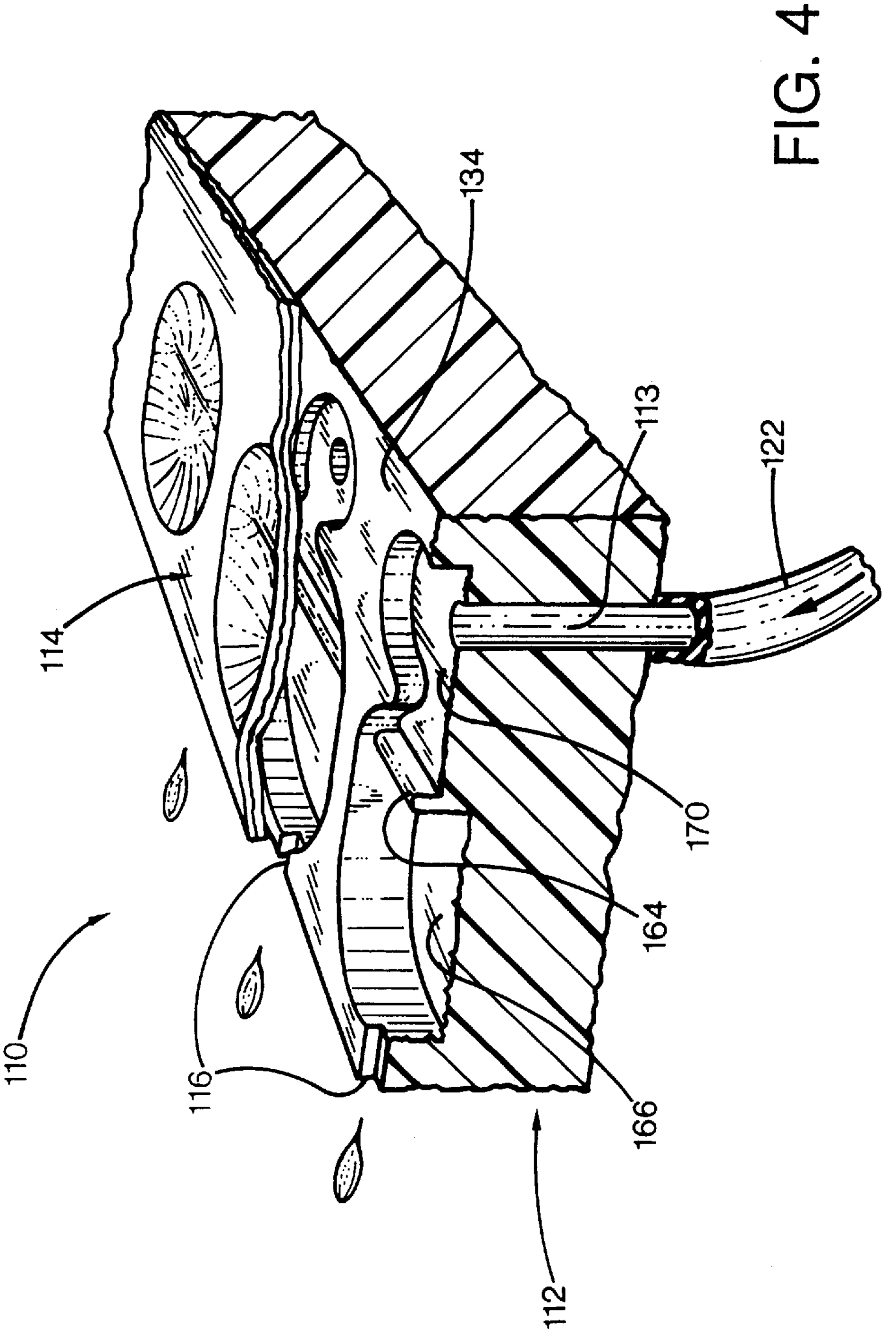
FIG. 4 is an enlarged perspective cut away view of an orifice plate according to an alternative embodiment of the invention.

FIG. 4 shows an alternative embodiment ink jet print head 110 having an orifice plate 112 and firing film 114. The basin configuration is analogous to that shown in the preferred embodiment of FIG. 2, with a firing chamber including a nozzle region 166 and an inlet region 170 separated by a ridge 164. But while the preferred embodiment has an inlet parallel to the plane of the plate, and a nozzle firing in a direction perpendicular, the embodiment of FIG. 4 is configured conversely. An ink inlet is provided by a bore 113 passing perpendicularly through the orifice plate between the ink conduit 122 and the inlet region 170. The firing nozzle 116 is a groove provided defined along the rear surface 134 of the plate between the nozzle region 166 and the edge of the plate, and is enclosed by the film 114 to provide a "side-shooting" operation. As shown, the floor of the basin may be at different levels in different regions in any of the contemplated embodiments.

Operation

Figure 5A:
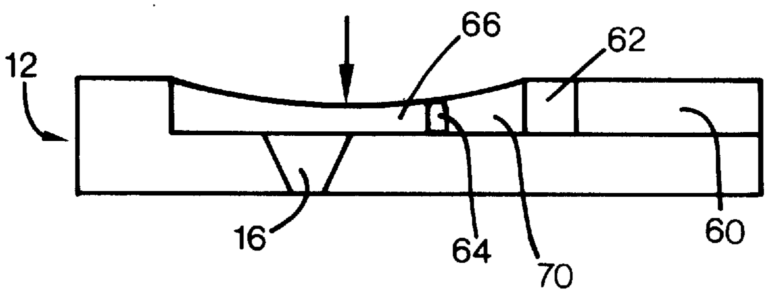
FIGS. 5A–5D are simplified cross sectional views of the embodiment of FIG. 1 showing a sequence of operations.
Figure 5B:
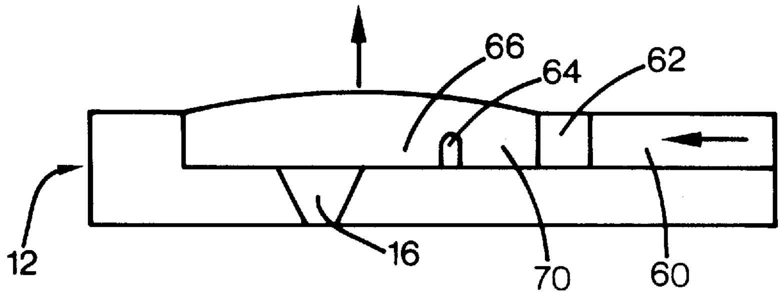
Figure 5C:
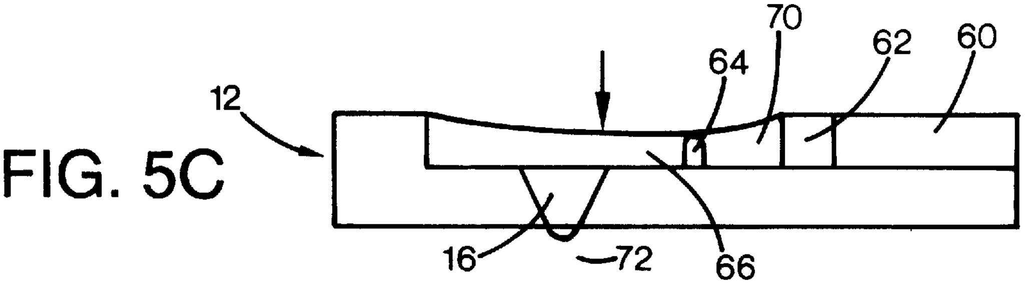

FIGS. 5A–5C show a typical sequence of operations. In FIG. 5A the apparatus is in a quiescent state, with the firing chamber at a minimum volume condition, and the film 14 pressing against the ridge. The ridge prevents the film from reaching its full concave molded shape by generating a dimple corresponding to the ridge. In the quiescent state, the controller applies no energy until printing is required.

When the controller indicates that an ink droplet is imminently required to be printed, the controller applies a voltage to the piezoelectric traces on the active layer of the firing film 14, causing the active layer to expand in dimensions along its planarity. In the manner of a bimetallic strip, the expansion of the active layer causes compression within the active layer that urges the film dome into the convex refilling position shown in FIG. 5B.

By the flexing the dome into the refilling position of FIG. 5B, the firing chamber expands to generate sufficient suction to draw ink from the ink supply through the inlet 60. In the preferred operation, application of the voltage to the active layer is only momentarily attained prior to ceasing the voltage.

Figure 5D:
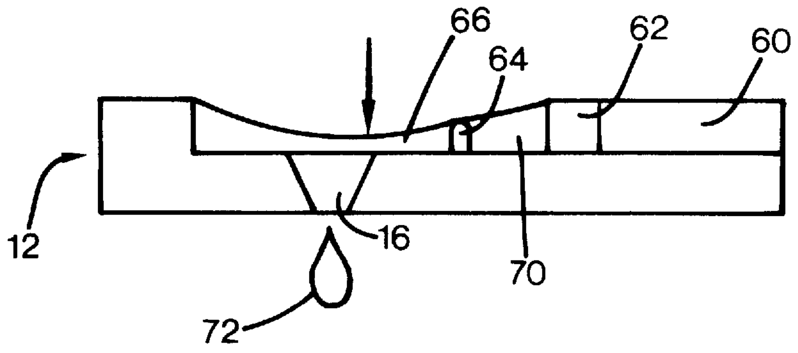

When the voltage pulse is ceased, the film returns forcibly returns toward its quiescent state, ejecting an ink droplet 72. As the film snaps back toward the quiescent state, it first contacts the ridge as shown in FIG. 5C, then continues to the quiescent position of 5D. While moving toward contact with the ridge, some of the pressure generated within the firing chamber may be dissipated by a back flow of ink out of the ink inlet. Any efficiency sacrifices are avoided after the film contacts the ridge, because an effective seal is formed. This ensures that substantially all subsequent volume reduction of the nozzle portion of the firing chamber (as occurs between FIG. 5C and FIG. 5D,) will efficiently displace an ink droplet of comparable volume.

The flexing film concept may be achieved by alternative means. Other approaches using the piezoelectric effect may involve placing the active layer on the opposite (ink) side of the film to generate expulsion of a droplet upon expansion of the active layer caused by application of a voltage. Also, a piezoelectric layer may be affixed to each side, generating active force both for expulsion and for refilling. This may be particularly applicable for a planar film that flexes in the manner of a drum skin, and which does so in proportion to the applied energy, instead of snapping between extremes. A two sided film may also be useful for a domed film that is thinner and quiescently stable in the concave and convex positions, requiring only a pulse to transition form one position to the other.

The above alternatives may be further modified by employing any available materials that shrink upon application of energy to provide flexing of the film in an opposite direction than would conventionally expanding piezoelectrics. More conventional alternatives may employ thermally modifiable layers. In the manner of a bimetallic strip formed of layers with differing coefficients of thermal expansion, a firing film may also be employed. The controller may apply a current to one or both layers, or to an additional resistive layer on the film to provide the heating needed to cause deflection. The film need not be of two metal layers, but may comprise a main flexible substrate with a heating resistor on one surface to generate a temperature gradient through the thickness of the substrate to provide flexing. In an apparatus using a thermally flexed film, the flow of ink would provide sufficient cooling of the film to permit the device to return to its original position.

Any method of causing flexing of a sheet may be used to provide the advantages of the invention. While the invention is described in terms of preferred and alternative embodiments, the invention may be modified without departing from such principles.

I claim:

1. An ink jet printing apparatus comprising:

an orifice plate at least in part defining a chamber, and at least in part defining a nozzle providing fluid communication out of the chamber, and an ink inlet connected between the chamber and a supply of ink;

a multilayer flexible firing film attached to the orifice plate and at least in part defining the chamber, such that the film provides a wall of the chamber;

the film having a first layer facing the chamber and connected to the orifice plate, and a second layer laminated to the first layer and spaced apart at least slightly from the orifice plate;

at least one of the first and second layers being dimensionally responsive to an application of energy, such that the area of said layer changes in response to the application of energy, whereby the film may flex between a firing position in which the film is flexed toward the orifice plate to expel ink from the nozzle, and a refilling position in which the film is flexed away from the orifice plate to draw into via the inlet into the chamber; and wherein the second layer is a piezoelectric film, and the first layer has a thickness greater than the thickness of the second layer, such that the first layer does not collapse or ripple in response to contraction of the second layer.

2. The apparatus of claim 1 wherein the piezoelectric film includes a plurality of linear piezoelectric drive traces that change length in response to an applied voltage.

3. An ink jet printing apparatus comprising:

an orifice plate at least in part defining a chamber, and at least in part defining a nozzle providing fluid communication out of the chamber, and an ink inlet connected between the chamber and a supply of ink;

a multilayer flexible firing film attached to the orifice plate and at least in part defining the chamber, such that the film provides a wall of the chamber;

the film having a first layer facing the chamber and connected to the orifice plate, and a second layer laminated to the first layer and spaced apart at least slightly from the orifice plate;

at least one of the first and second layers being dimensionally responsive to an application of energy, such that the area of said layer changes in response to the application of energy, whereby the film may flex between a firing position in which the film is flexed toward the orifice plate to expel ink from the nozzle, and a refilling position in which the film is flexed away from the orifice plate to draw into via the inlet into the chamber; and wherein the film includes a curved dish portion that is movable between a first position in which it bulges into the chamber, and a second position in which it bulges out of the chamber.

4. The apparatus of claim 3 wherein the dish portion is stable only at the first and second positions, and is unstable at any intermediate position between the first and second positions, such that the dish portion snaps between the first and second positions upon application of a force.

5. The apparatus of claim 3 wherein the first and second layers have different coefficients of thermal expansion.

6. An ink jet printing apparatus comprising:

an orifice plate at least in part defining a chamber, and at least in part defining a nozzle providing fluid communication out of the chamber, and an ink inlet connected between the chamber and a supply of ink;

a multilayer flexible firing film attached to the orifice plate and at least in part defining the chamber, such that the film provides a wall of the chamber;

the film having a first layer facing the chamber and connected to the orifice plate, and a second layer laminated to the first layer and spaced apart at least slightly from the orifice plate;

at least one of the first and second layers being dimensionally responsive to an application of energy, such that the area of said layer changes in response to the application of energy, whereby the film may flex between a firing position in which the film is flexed toward the orifice plate to expel ink from the nozzle, and a refilling position in which the film is flexed away from the orifice plate to draw into via the inlet into the chamber; and wherein the orifice plate includes a major chamber wall defining the chamber opposite the film, the orifice plate including a ridge protruding from the wall toward the film at a position between the nozzle and the ink inlet.

7. The apparatus of claim 6 wherein the ridge spans across the entire chamber.

8. The apparatus of claim 6 wherein the ridge protrudes from the major wall by a height less than the distance between the wall and the film when the film is in the refilling position.

9. The apparatus of claim 6 wherein the nozzle has a smaller cross sectional area than the ink inlet, such that expansion of the chamber draws ink readily through the inlet, while the nozzle resists drawing fluid into the chamber.

10. The apparatus of claim 6 wherein the first and second layers have different coefficients of thermal expansion.

11. A method of printing with an ink jet print head defining a firing chamber with an inlet connected to an ink supply and an outlet nozzle, with a multilayer flexible wall defining at least a portion of the chamber, the method comprising the steps:

outwardly bowing the flexible wall from the chamber to enlarge the chamber volume and draw ink from the ink supply into the chamber; and inwardly bowing the flexible wall into the chamber to reduce the chamber volume to expel ink from the chamber through the nozzle.

12. The method of claim 11 wherein at least one of the steps of inwardly and outwardly bowing the flexible wall include imparting energy to a single layer of the wall to enlarge said layer in at least one longitudinal dimension relative to another of the wall layers, such that the differential expansion and contraction of the flexible wall layers generates the bowing motions.

13. The method of claim 12 including maintaining said single layer with a substantially constant thickness while enlarging said layer in at least one longitudinal dimension.

14. The method of claim 12 wherein imparting energy includes heating the single layer.

15. The method of claim 12 wherein imparting energy includes applying a voltage to a piezoelectric material.

16. The method of claim 11 wherein the firing chamber includes a ridge between the nozzle and the inlet, and wherein inwardly bowing the flexible wall into the chamber includes inwardly bowing the wall into contact with the ridge to prevent further unrestricted ink flow toward the inlet, then further bowing the wall to further reduce the chamber volume while the wall is contacting the ridge.

17. An ink jet printing apparatus comprising:

an orifice plate defining a basin, and at least in part defining a nozzle providing fluid communication out of the chamber, and an ink inlet connected between the chamber and a supply of ink;

a multilayer flexible firing film attached to the orifice plate and including a dome portion flexible between a concave position and a convex position, the dome portion at least in part defining the chamber, such that the film provides a wall of the chamber; and at least a portion of the dome portion being dimensionally responsive to an application of energy, such that the dome changes between the concave and convex positions in response to the application and de-application of energy, whereby the film may flex between a firing position in which the film is flexed toward the orifice plate to expel ink from the nozzle, and a refilling position in which the film is flexed away from the orifice plate to draw ink via the inlet into the chamber.

18. The apparatus of claim 17 wherein the orifice plate includes a major chamber wall defining the chamber opposite the film, the orifice plate including a ridge protruding from the wall toward the film at a position between the nozzle and the ink inlet.

19. The apparatus of claim 17 wherein the dome comprises a film having a piezoelectric layer.

20. The apparatus of claim 17 wherein the dome comprises a film with first and second layers having different coefficients of thermal expansion.

* * * * *

UNITED STATES PATENT AND TRADEMARK OFFICE

CERTIFICATE OF CORRECTION

PATENT NO. : 5,812,163
DATED : Sep. 22, 1998
INVENTOR(S) : Wong, M.

It is certified that error appears in the above-identified patent and that said Letters Patent is hereby corrected as shown below:

At column 2, line 59, change "rear surface 43" to --rear surface 34--.

At column 4, line 18, change "form" to --from--.

At column 4, line 61, change "draw into" to --draw ink--.

At column 5, line 24, change "draw into" to --draw ink--.

At column 5, line 56, change "draw into" to --draw ink--.

Signed and Sealed this

Eighth Day of August, 2000

Attest:

Q. TODD DICKINSON

Attesting Officer

*Director of Patents and Trademarks*